United States Patent
Savanth et al.

(10) Patent No.: US 9,940,993 B2
(45) Date of Patent: Apr. 10, 2018

(54) STORAGE BITCELL WITH ISOLATION

(71) Applicant: ARM Limited, Cambridge (GB)

(72) Inventors: Parameshwarappa Anand Kumar Savanth, Cambridge (GB); James Edward Myers, Bottisham (GB); Pranay Prabhat, Cambridge (GB); David Walter Flynn, Cambridge (GB); Shidhartha Das, Upper Cambourne (GB); David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/093,457

(22) Filed: Apr. 7, 2016

(65) Prior Publication Data
US 2017/0294222 A1     Oct. 12, 2017

(51) Int. Cl.
G11C 5/06      (2006.01)
G11C 11/419    (2006.01)

(52) U.S. Cl.
CPC ............ *G11C 11/419* (2013.01); *G11C 5/063* (2013.01)

(58) Field of Classification Search
CPC ................................ G11C 11/419; G11C 5/063
See application file for complete search history.

(56) References Cited

U.S. PATENT DOCUMENTS

| | | | |
|---|---|---|---|
| 5,311,070 A | 5/1994 | Dooley | |
| 5,680,356 A | 10/1997 | Yamauchi | |
| 2002/0003244 A1* | 1/2002 | Tooher | G11C 11/412 257/204 |
| 2007/0139996 A1* | 6/2007 | Ozawa | G11C 11/412 365/154 |
| 2009/0109764 A1* | 4/2009 | Houston | G11C 11/413 365/189.09 |
| 2012/0008377 A1* | 1/2012 | Chuang | G11C 11/419 365/154 |
| 2012/0243287 A1 | 9/2012 | Kawasumi | |
| 2014/0138776 A1 | 5/2014 | Chang et al. | |
| 2015/0103604 A1* | 4/2015 | Sheikh | G11C 11/419 365/189.05 |

OTHER PUBLICATIONS

PCT International Search Report and Written Opinion; PCT/GB2017/050945; dated Jul. 13, 2017.

* cited by examiner

*Primary Examiner* — Mohammed A Bashar
(74) *Attorney, Agent, or Firm* — Pramudji Law Group PLLC; Ari Pramudji

(57) ABSTRACT

A storage bitcell comprising a first inverter cross-coupled with a second inverter, both the first and second inverter being in a path between a first potential and a second potential; wherein a first isolator is connected in the path between the first inverter and the first potential. The storage bitcell has particular application as Static Random-Access Memory (SRAM) circuitry.

6 Claims, 7 Drawing Sheets

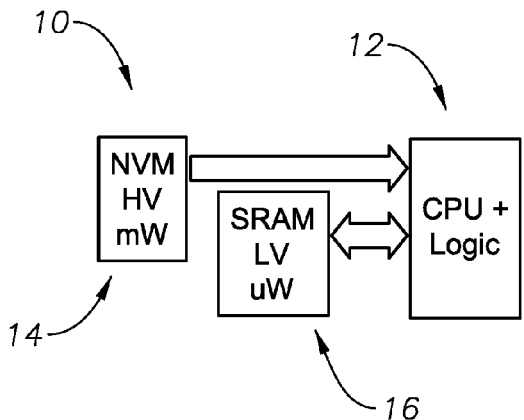
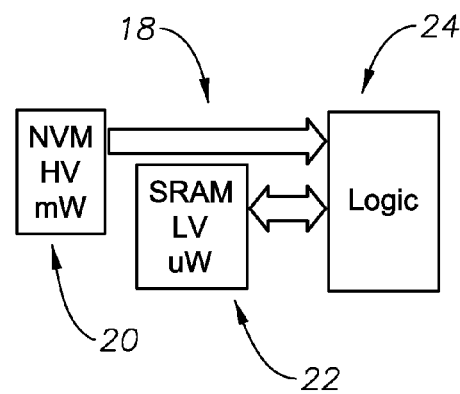
FIG. 1A                FIG. 1B
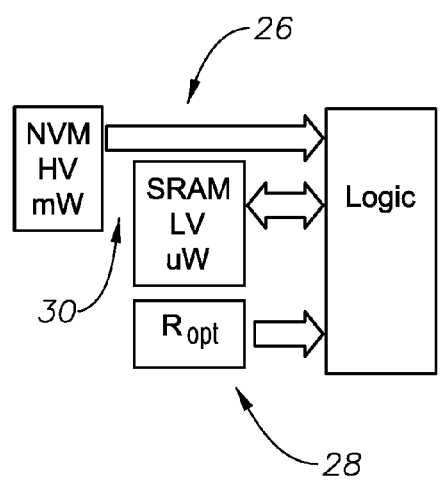
FIG. 1C

STORAGE BITCELL WITH ISOLATION

TECHNICAL FIELD

The present techniques relate to a storage bitcell. More particularly, the techniques relate to Static Random-Access Memory (SRAM) circuitry and read and write functions associated on the circuitry that allow retention of the bit state and read at ultra-low supply voltages. Memory bitcells according to present techniques with low voltage retention and low read energy have particular, although not exclusive, application for use in energy harvested sensor nodes, such as solar cell powered nodes.

BACKGROUND

Cloud computing services are becoming more common. More and more devices are being connected to the cloud, for example as part of the "Internet of Things". For example, relatively small devices such as wireless sensor nodes can be connected to the cloud so that they can be accessed and controlled using remote systems. For example, data from a temperature sensor may be periodically aggregated at a remote location and accessed from another device. Hence, there is an increasing amount of data being sensed and then collected by cloud platforms and their providers. Data may be held in memory bitcells and those bitcells with low voltage retention and low read energy provide greater efficiency of power usage. Efficient power usage is desired where sources of energy may be harvested by a sensor node incorporating a solar cell or where power supply is aggregated across many, perhaps thousands, of sensors.

Accordingly, providing an electronic storage device with a low retention voltage and low read energy is particularly beneficial.

SUMMARY

According to a first technique, there is provided a storage bitcell comprising a first inverter cross-coupled with a second inverter, both the first and second inverter being in a path between a first potential and a second potential; wherein a first isolator is connected in the path between the first inverter and the first potential.

In techniques, the storage bitcell is a SRAM cell and the first and second inverters each comprise two transistors in each inverter. The skilled person will be familiar with characterising an SRAM cell by Static Noise Margin (SNM) and SNM can be characterised by the magnitude of noise voltage required to flip a stored state. Noise may occur on both first and second potential sources such as on supply and ground lines, a substrate upon which the inverters are formed and through capacitive coupling on internal nodes of the storage circuitry. When an external noise is larger than the SNM, the state of the SRAM cell can change and data can be lost.

In operation, the first inverter may hold a "1" at a first potential and may only flip to a "0" in the presence of a second potential, such as a ground voltage. Accordingly, present techniques provide an isolator between the second potential and the first inverter to increase the magnitude of noise required to cause the flip.

Techniques include a second isolator connected in the path between the first inverter and the second potential, a third isolator connected in the path between the second inverter and the first potential, a fourth isolator connected in the path between the second inverter and the second potential.

Accordingly, a second technique provides a storage bitcell comprising a first inverter cross-coupled with a second inverter, each inverter connected in a path between a first potential and a second potential; wherein a first isolator is connected in the path between the first inverter and the first potential, a second isolator is connected in the path between the first inverter and the second potential, a third isolator is connected in the path between the second inverter and the first potential and a fourth isolator is connected in the path between the second inverter and the second potential.

In the first and the second techniques when writing into the storage bitcell, the inverter is not isolated so as to enable the data to be written correctly. But in read/retention mode the isolator uses the state already stored to isolate the inverter from the appropriate potential to improve SNM.

BRIEF DESCRIPTION OF THE DRAWINGS

Embodiments will now be described with reference to the accompanying figures of which:

FIGS. 1A, 1B, and 1C are schematic diagrams of a read optimised memory system;

DETAILED DESCRIPTION

Referring to FIG. 1a, a memory system 10 comprises code for the sensor node Central Processing Unit 12 (CPU) stored in some form of a Non-volatile Memory (NVM) 14 to provide random access memory and a SRAM 16 for a scratch-pad memory. The NVM 14 may be a Flash memory, having a high-voltage operation (say, greater than 1.2V) and an active power operation (say, in the order of a mW). Typically, the SRAM 16 can operate at much lower voltages and have μW order power dissipation.

A memory system 18 designed for low power operation is illustrated in FIG. 1b where the NVM 20 is only turned on during boot-up and code is copied into the SRAM 22. The CPU 24 executes the code from the SRAM 22 while the NVM can be switched off.

Unlike conventional mobile or high performance computing systems, wireless sensor nodes benefit from a relatively fixed workload for long periods of time. Such wireless sensor nodes may perform the same activity periodically and enter low-power modes upon completion. The periodic activity, which may be initiated by an interrupt, can be specified using a small percentage of the code memory which in its entirety could-comprise boot-up initialisation routines, communication and network routines, as well as cryptographic and security protocol algorithms.

A memory system 26 in FIG. 1c seeks further optimisation. According to present techniques, an ultra-low voltage read-optimized memory 28 is used to allow SRAM 30 to be retained or powered down when not used.

Figure 2:
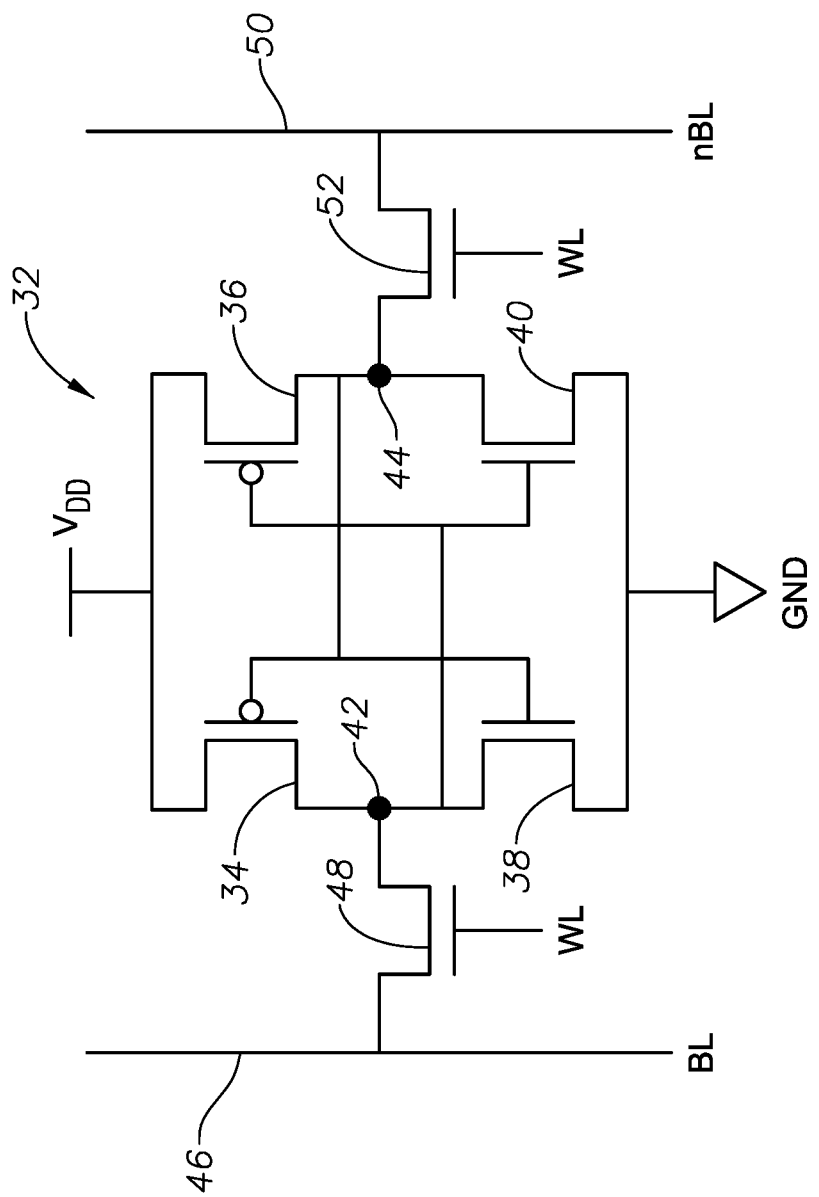
FIG. 2 is a schematic diagram of a 6T SRAM storage bitcell.

Referring to FIG. 2, a latch circuit such as a 6T SRAM memory cell 32 is shown such as may be used in an SRAM memory system. The 6T SRAM memory cell 32 comprises two p-channel transistors 34, 36 and two n-channel transistors 38, 40. A node 42 is provided between 34 and 38, and similarly a node 44 is provided between 36 and 40. A bit line BL 46 is connected to the node 42 via an access transistor 48. Similarly, an inverted bit line nBL 50 is connected to the node 44 by an access transistor 52. In use, the two sets of transistors 34 and 38, and 36 and 40 are cross-coupled inverters forming a bistable device capable of storing binary information and having both read and write capabilities. A first state can be configured when the node 42 is at ground potential (GND) and the node 44 is at supply voltage potential Vdd. A second state can be configured when the node 42 is at the supply voltage potential Vdd and the node 44 is at the ground potential (GND).

Figure 3A:
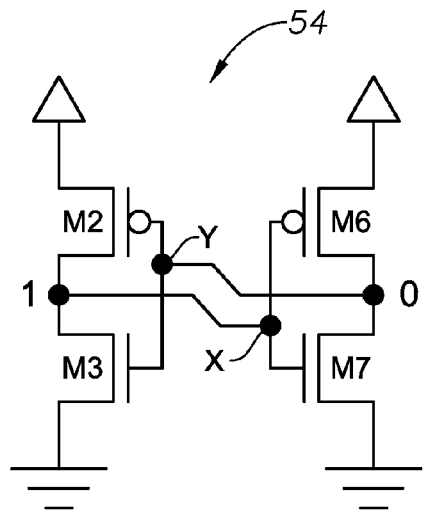
FIG. 3A is a schematic diagram of a latch structure forming part of a SRAM storage bitcell.

A schematic diagram of a latch structure 54 forming part of a SRAM storage bitcell is illustrated in FIG. 3A with a 1 and 0 being stored by M2, M3 and M6, M7 transistor pairs respectively. Static Noise Margin can be characterized by the magnitude of noise voltage required to flip the stored state and such noise may occur on supply or ground lines, the substrate and through capacitive coupling on internal nodes. Nodes X and Y may be tested using noise voltage sources in order test the stability of the latch structure 54.

Figure 3B:
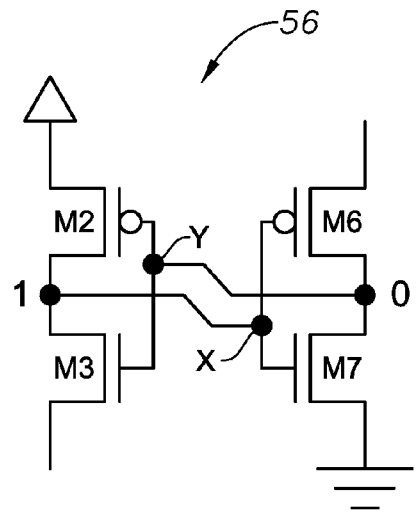
FIG. 3B is a schematic diagram of a latch structure forming part of a SRAM storage bitcell according to a first embodiment.

The transistor M2 and M3 pair holds a 1 and can flip to a 0 in the presence of a ground voltage. The transistor M6 and M7 pair holds a 0 and can flip to a 1 in the presence of supply voltage. Referring to FIG. 3B, according to an embodiment, the latch structure 54 is modified to a latch structure 56 by isolating the transistor pair M2 and M3 from ground. In this way, the magnitude of noise required to cause the flip of state from a 1 to 0 can be increased. The noise margin can be further improved by isolating a supply voltage potential Vdd to the transistor pair M6 and M7. According to present techniques, the isolation can be provided by using a latch structure 58 as illustrated in FIG. 3C.

Figure 3C:
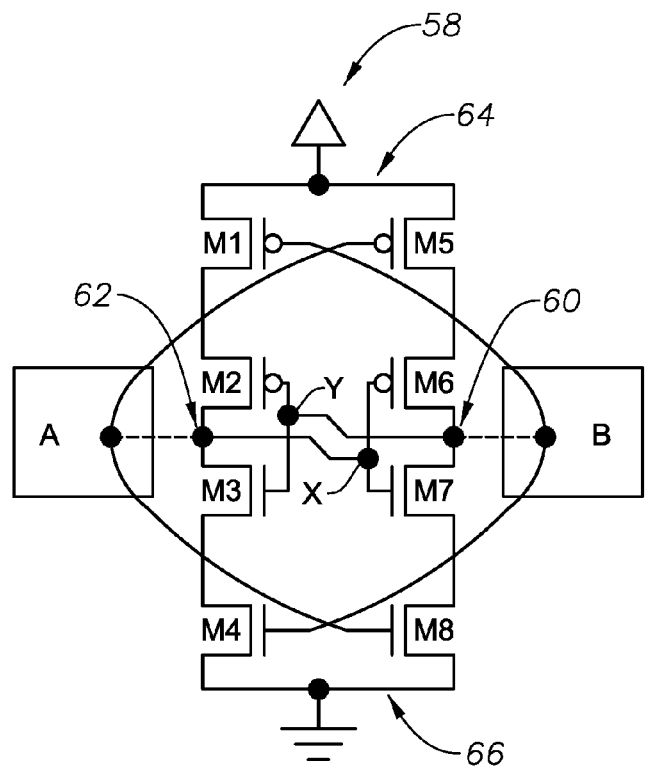
FIG. 3C is a schematic diagram of a latch structure forming part of a SRAM storage bitcell according to a second embodiment.

Referring to FIG. 3C, a latch structure 58 forming part of a SRAM storage bitcell comprises two p-channel transistors M2, M6 and two n-channel transistors M3 and M7. A node Y is provided between a gate terminal of M2 and a gate terminal of M3 and connected to a node 60 between a drain terminal of M6 and a source terminal of M7. The node 60 is connected to further circuitry B, shown in greater detail in FIG. 4.

A node X is provided between a gate terminal of M6 and a gate terminal of M7 and connected to a node 62 between a drain terminal of M2 and a source terminal of M3. The node 62 is connected to control circuitry A, shown in greater detail in FIG. 4.

In FIG. 3C, isolation from a voltage supply rail 64 is provided by using M1 located in an electrical path between M2 and the voltage supply rail 64, and transistor M5 located in an electrical path between M6 and the voltage supply rail 64. Isolation from a ground potential 66 is provided by M4 located in an electrical path between M3 and the ground potential 66, and M8 located in an electrical path between M7 and the ground potential 66.

In FIG. 3C, a gate terminal of isolator M1 is shown connected to a gate terminal of isolator M4 and a gate terminal of isolator M5 is shown connected to a gate terminal of isolator M8. Referring to FIG. 4, the connection of isolators M1 and M4 occurs through a node 68 and connection of isolators M5 and M8 occurs through a node 70.

Figure 4A:
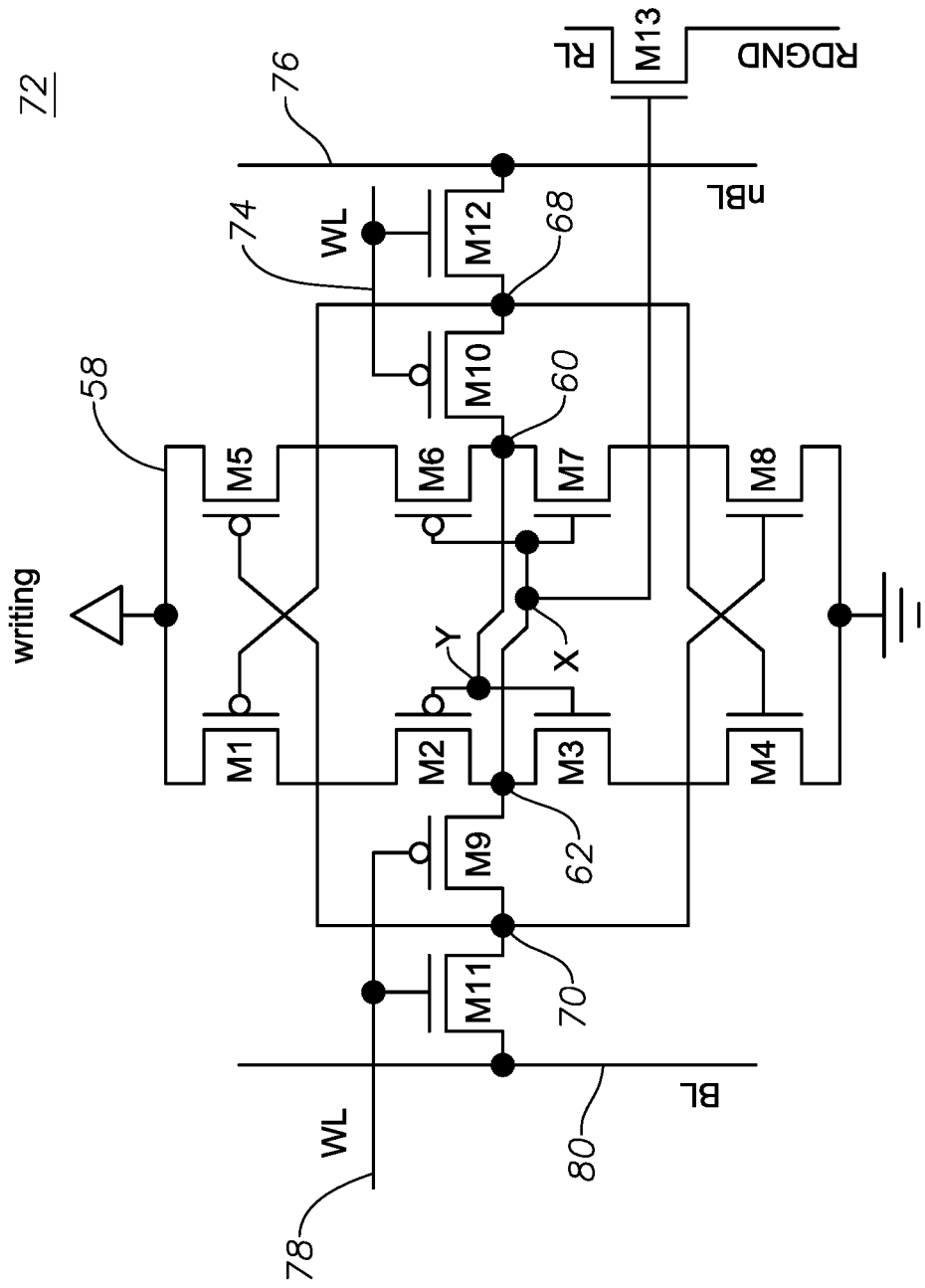
FIGS. 4A and 4B are schematic diagrams of a 13T SRAM cell according to a third embodiment.
Figure 4B:
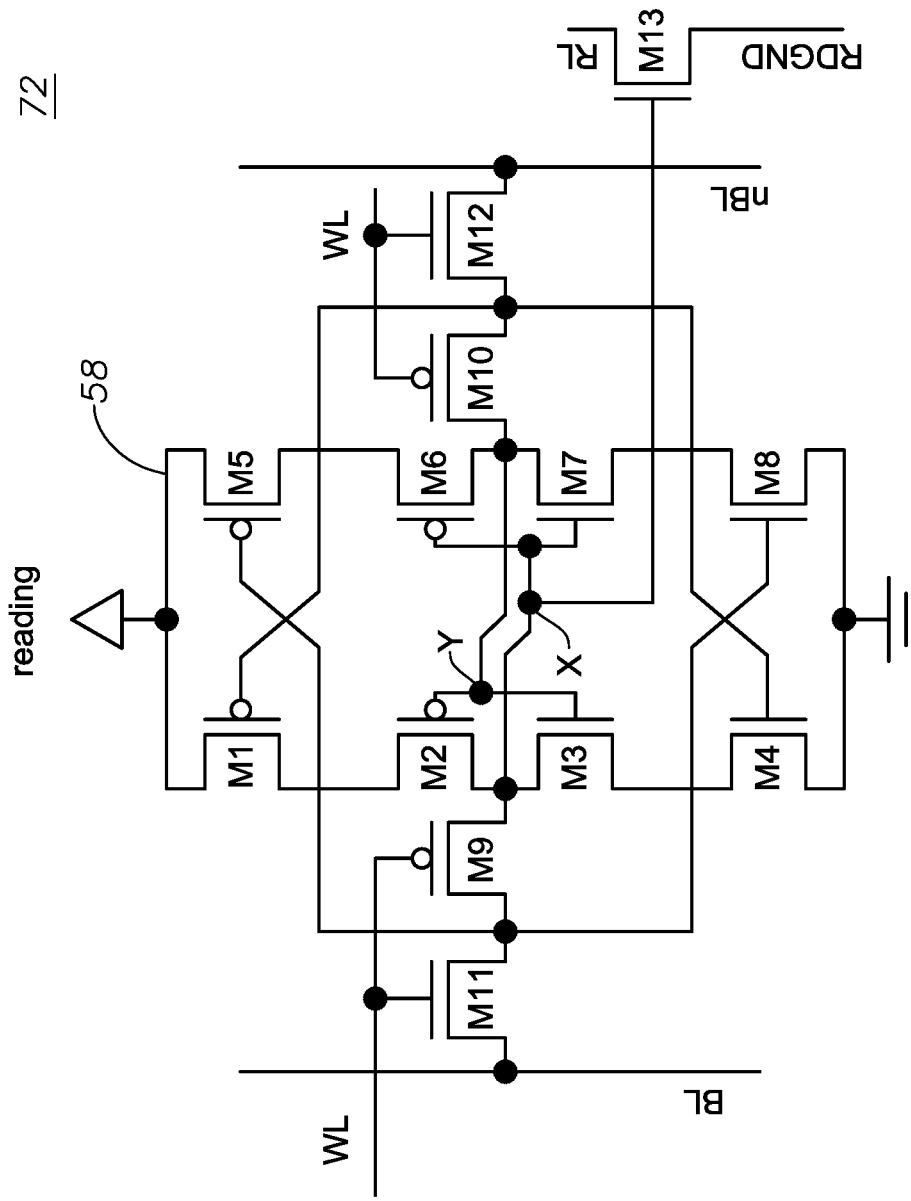

FIG. 4 is a schematic diagram of a bitcell 72 according to present techniques. In operation, bitcell 72 is shown in a writing mode (FIG. 4a) and a reading mode (FIG. 4b).

Referring to FIG. 4a, the latch structure 58 forming part of the SRAM storage bitcell 72 comprises two p-channel transistors M2, M6 and two n-channel transistors M3 and M7. A node Y is provided between a gate terminal of M2 and a gate terminal of M3 and connected to the node 60 between a drain terminal of M6 and a source terminal of M7. The node 60 is connected to control circuitry B (not shown in FIG. 4) comprising a source terminal of a p-channel transistor M10 having a drain terminal connected to node 68, which sits in an electrical path between isolators M1 and M4. A gate terminal of M10 is connected to a word-line WL 74. The n-channel transistor M12 comprises a source terminal connected to the node 68, a gate terminal connected to the word-line WL 74 and a drain terminal connected to an inverted bit line nBL 76.

Also in FIG. 4, the node X is provided between a gate terminal of M6 and a gate terminal of M7 and is connected to the node 62 between a drain terminal of M2 and a source terminal of M3. The node 62 is connected to control circuitry A (not shown in FIG. 4) comprising of a drain terminal of a p-channel transistor M9 having a source terminal connected to node 70, which sits in an electrical path between isolators M5 and M8. A gate terminal of M9 is connected to a word-line WL 78. The n-channel transistor M11 comprises a drain terminal connected to the node 70, a gate terminal connected to the word-line WL 78 and a source terminal connected to a bit line, BL 80. As also seen in FIG. 4, a gate terminal of n-channel transistor M13 is connected to node X having source terminal connected to read line to ground (RDGND) and drain terminal connected to read line (RL). Although not shown in FIG. 4, a sense amplifier can be used for differential reads.

Accordingly, with reference to FIG. 4 in comparison with the techniques illustrated with reference to FIG. 3C, transistors M9 and M10 are added to the bitcell layout of FIG. 4 to allow differential writes and transistor M13 is added for single-ended read. The bit line BL 80 is connected to the node 62 via the access transistor M11. Similarly, the inverted bit line nBL 76 is connected to the node 60 by the access transistor M12.

FIG. 4a illustrates techniques for writing by placing data on the bitlines BL 80 and nBL 76 and asserting word-line WL 74, 78, which turns off feedback transistors M9 and M10. During retention and read, FIG. 4b, word-line WL=0 isolates the bitlines and turns the feedback transistors (M9, M10) on.

Figure 5A:
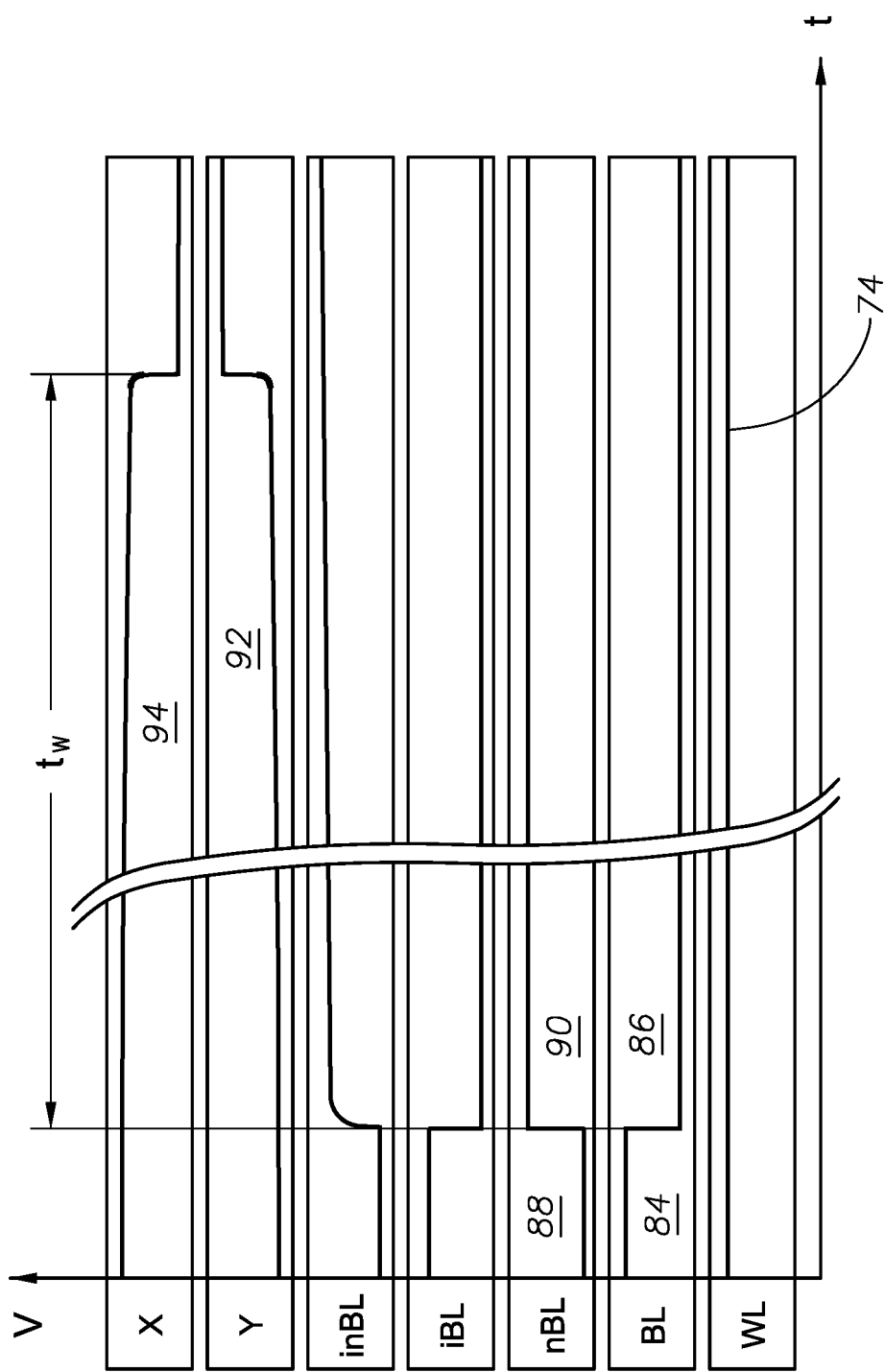
FIG. 5A is a schematic diagram of the 13T SRAM cell in a writing operation and a reading operation.
Figure 5B:
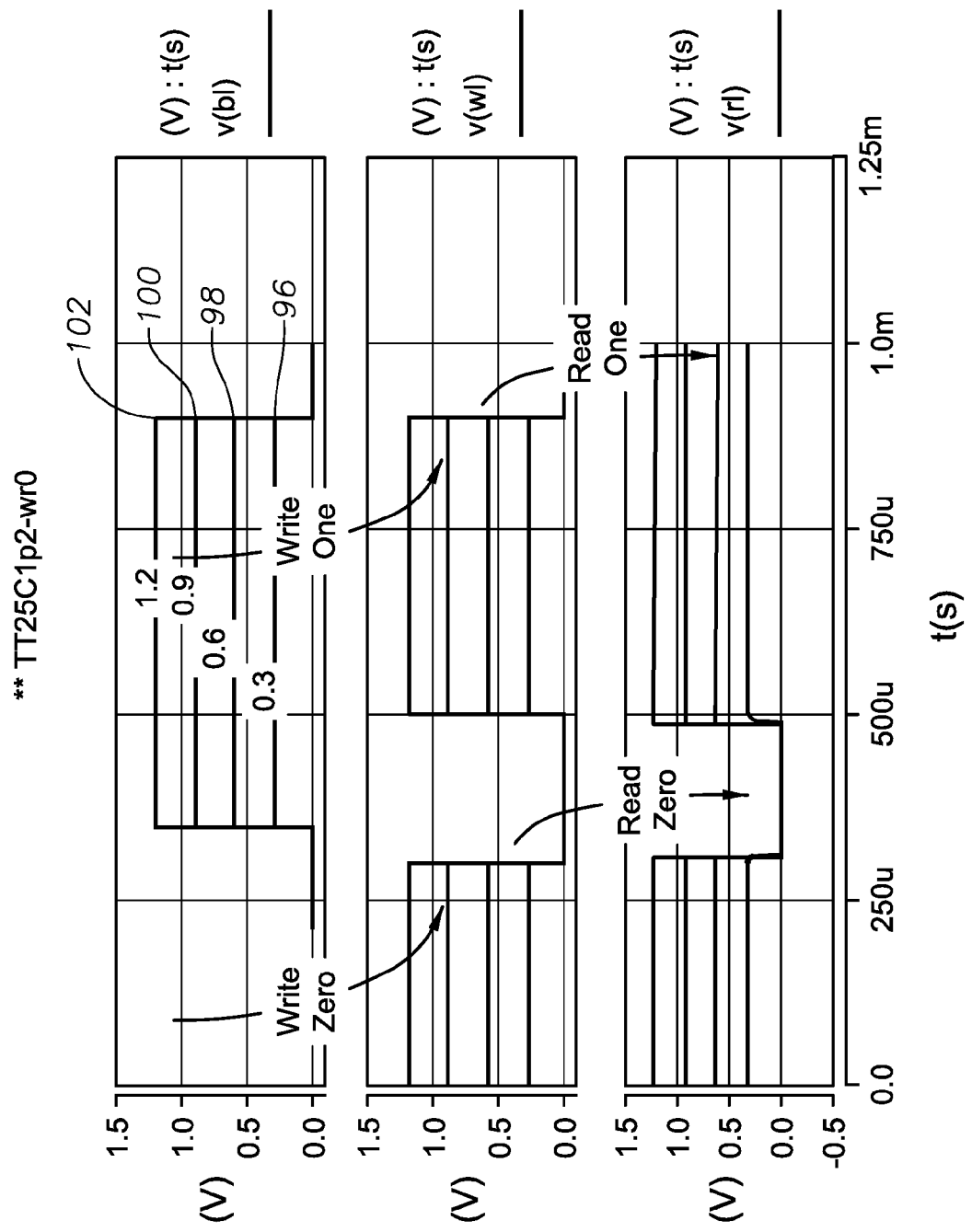
FIG. 5B is a schematic diagram of associated timing waveforms for the 13T SRAM cell.

FIG. 5a is a schematic diagram of associated timing waveforms for the 13T SRAM cell. The word-line WL 74, 78 is forced high 82 for the simulation. Bit line 80 is high 84 until time period $t_W$ (write delay) commences when it is transitioned to low 86, and inverted bit line nBL 76 is low 88 until time period $t_W$ commences when it is transitioned to high 90. Node 68 (here referred to as inBL) follows the rise and fall of inverted bit line 76, whereas node 70 (here referred to as iBL) follows the rise and fall of bit line 80. Since the access transistors M11 and M12 are NFETS, inBL has a slow rise relative to nBL. IBL=0 turns transistor M5 on causing node Y to build up charge 92. Similarly, inBL=1 turns on transistor M4 causing node X to discharge 94. After a certain time tw dictated by the magnitude of leakage through transistors M3 and M6, nodes X and Y flip to their final states (x=BL and Y=nBL). Using timing techniques described with reference to FIG. 5a, the write and read waveforms for different supply voltages.

As will be appreciated by one skilled in the art, the present techniques may be embodied as a circuit, a method of driving the circuit and may be controllable by a computer program. Accordingly, the present techniques may take the form of an entirely hardware embodiment or an embodiment combining software and hardware.

Computer program code for carrying out operations of the present techniques may be written in any combination of one or more programming languages, including object oriented programming languages and conventional procedural programming languages.

For example, program code for carrying out operations of the present techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language).

It will be clear to one skilled in the art that many improvements and modifications can be made to the foregoing exemplary embodiments without departing from the scope of the present techniques.

Accordingly, in a first technique a storage bitcell comprises a first inverter cross-coupled with a second inverter, both the first and second inverter being in a path between a first potential and a second potential; wherein a first isolator is connected in the path between the first inverter and the first potential with a state and operation dependent control.

By state and operation control when writing into the bitcell, the inverter (for example, M2-M3) is not isolated so as to enable the data to be written correctly. But in read/retention mode the isolator uses the state already stored to isolate the inverter from the appropriate rail to improve Signal to Noise Margin.

In embodiments, a second isolator may be connected in the path between the second inverter and the first potential. Further, a third isolator may be connected in the path between the first inverter and the second potential. A fourth isolator may be connected in the path between the second inverter and the second potential with a state and operation dependent control.

In embodiments, the first potential is a voltage supply rail and the second potential is a ground rail. The first and second isolators may be p-channel transistors and the third and fourth isolators are n-channel transistors. In embodiments, a gate terminal of the first isolator is connected to gate terminal of the third isolator and a gate terminal of the second isolator is connected to a gate terminal of fourth isolator. Moreover, a first internal node is located in the path between a gate terminal of the first isolator and the gate terminal of the third isolator and a first access transistor is connected to the first internal node.

In embodiments, the first access transistor may be connected to a positive bit line and the first access transistor may be a N-channel transistor. In embodiments the first access transistor is connected to the first internal node by a P-channel transistor.

According to techniques, a second internal node may be located in the path between a gate terminal of the second isolator and the gate terminal of the fourth isolator and a second access transistor is connected to the second internal node.

Herein, the second access transistor may be connected to an inverted bit line. In embodiments, the second access transistor is an n-channel transistor and the second access transistor may be connected to the second internal node by a p-channel transistor. In embodiments, a read transistor is provided on a read line and is connected to a node of the second inverter and the read transistor is an n-channel transistor.

In all embodiments, the present techniques are particularly suited to use in a Static Random-Access Memory (SRAM) circuitry comprising a storage bitcell described herein.

The invention claimed is:

1. A circuit comprising:
a first inverter comprising a first internal node;
a second inverter comprising a second internal node and cross-coupled to the first inverter;
a first feedback transistor comprising a first terminal and a second terminal, the first terminal being connected to the first internal node;
a second feedback transistor comprising a first terminal and a second terminal, the first terminal being connected to the second internal node;
a first p-channel transistor comprising a drain terminal connected to the first inverter, and a gate connected to the second terminal of the second feedback transistor;
a second p-channel transistor comprising a drain terminal connected to the second inverter, and a gate connected to the second terminal of the first feedback transistor;
a first n-channel transistor comprising a drain terminal connected to the first inverter, and a gate connected to the second terminal of the second feedback transistor; and
a second n-channel transistor comprising a drain terminal connected to the second inverter, and a gate connected to the second terminal of the first feedback transistor.

2. The circuit as set forth in claim 1, further comprising:
a first word-line connected to a gate of the first feedback transistor; and
a second word-line connected to a gate of the second feedback transistor.

3. The circuit as set forth in claim 2, further comprising:
a first access transistor comprising a first terminal, a second terminal and a gate, the first terminal being connected to the second terminal of the first feedback transistor, the gate being connected to the first word-line;
a first bit-line connected to the second terminal of the first access transistor;
a second access transistor comprising a first terminal, a second terminal and a gate, the first terminal being connected to the second terminal of the second feedback transistor, the gate being connected to the second word-line; and
a second bit-line connected to the second terminal of the second access transistor.

4. The circuit as set forth in claim 3, further comprising:
a transistor comprising a first terminal, a second terminal and a gate connected to the second terminal of the second feedback transistor;
a read-line-to-ground connected to the first terminal of the transistor; and
a read line connected to the second terminal of the transistor.

5. The circuit as set forth in claim 4, further comprising:
a voltage supply rail, the first and second p-channel transistors each comprising a source terminal connected to the voltage supply rail; and
a ground, the first and second n-channel transistors each comprising a source terminal connected to the ground.

6. The circuit as set forth in claim 4, wherein
the first and second feedback transistors are each p-channel transistors; and
the first and second access transistors are each n-channel transistors.

\* \* \* \* \*